(12) United States Patent
Wu

(10) Patent No.: US 12,218,032 B2
(45) Date of Patent: Feb. 4, 2025

(54) SEMICONDUCTOR APPARATUS AND MANUFACTURING METHOD THEREOF, AND THREE-DIMENSIONAL INTEGRATED CIRCUIT

(71) Applicant: CHANGXIN MEMORY TECHNOLOGIES, INC., Hefei (CN)

(72) Inventor: Ping-Heng Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 381 days.

(21) Appl. No.: 17/648,157

(22) Filed: Jan. 17, 2022

(65) Prior Publication Data

US 2022/0139808 A1  May 5, 2022

Related U.S. Application Data

(63) Continuation of application No. PCT/CN2021/106570, filed on Jul. 15, 2021.

(30) Foreign Application Priority Data

Jul. 20, 2020 (CN) .......................... 202010699333.3

(51) Int. Cl.
*H01L 23/48* (2006.01)
*H01L 21/768* (2006.01)
*H01L 23/373* (2006.01)

(52) U.S. Cl.
CPC ...... *H01L 23/481* (2013.01); *H01L 21/76898* (2013.01); *H01L 23/3735* (2013.01); *H01L 21/76831* (2013.01); *H01L 21/76871* (2013.01)

(58) Field of Classification Search
CPC ............. H01L 23/481; H01L 21/76898; H01L 23/3735; H01L 21/4871; H01L 23/3677;
(Continued)

(56) References Cited

U.S. PATENT DOCUMENTS 8,294,261 B2  10/2012 Mawatari
8,314,483 B2  11/2012 Lin
(Continued)

FOREIGN PATENT DOCUMENTS

CN   103258789 A   8/2013
CN   103426864 A   12/2013
(Continued)

OTHER PUBLICATIONS

JP2011-249563 (Year: 2011).*
(Continued)

*Primary Examiner* — Patricia D Valenzuela
(74) *Attorney, Agent, or Firm* — Syncoda LLC; Feng Ma

(57) ABSTRACT

A semiconductor apparatus includes a substrate and a through silicon via (TSV) structure; a groove is disposed on the substrate; the TSV structure is disposed on the substrate; and a first end of the TSV structure is exposed in the groove, and a distance between an end surface of the first end and a bottom wall of the groove is smaller than the depth of the groove. The first end of the TSV structure is exposed so as to facilitate heat dissipation; the distance between the end surface of the first end and the bottom wall of the groove is smaller than the depth of the groove, i.e., the first end of the TSV structure is sunken in the groove, and other structures will not be affected.

8 Claims, 32 Drawing Sheets

(58) Field of Classification Search
CPC . H01L 23/367; H01L 21/4846; H01L 21/486; H01L 23/49827; H01L 23/49838; H01L 21/76831; H01L 21/76877; H01L 21/76871

See application file for complete search history.

(56) References Cited

U.S. PATENT DOCUMENTS

| | | | |
|---|---|---|---|
| 8,609,506 | B2 | 12/2013 | Lin et al. |
| 8,772,946 | B2 | 7/2014 | Uzoh |
| 8,779,572 | B2 | 7/2014 | Lin et al. |
| 9,000,600 | B2 | 4/2015 | Uzoh et al. |
| 9,349,669 | B2 | 5/2016 | Uzoh et al. |
| 2010/0187670 | A1 | 7/2010 | Lin |
| 2012/0313247 | A1* | 12/2012 | Yu .................... H01L 21/76831 257/E21.597 |
| 2013/0078765 | A1 | 3/2013 | Lin et al. |
| 2013/0200525 | A1 | 8/2013 | Lee |
| 2013/0328186 | A1 | 12/2013 | Uzoh |
| 2014/0054761 | A1 | 2/2014 | Lin et al. |
| 2014/0217607 | A1 | 8/2014 | Uzoh et al. |
| 2015/0187673 | A1 | 7/2015 | Uzoh et al. |
| 2015/0221612 | A1 | 8/2015 | Gandhi |
| 2015/0364400 | A1 | 12/2015 | Dando |
| 2017/0352645 | A1 | 12/2017 | Gandhi |
| 2019/0006323 | A1 | 1/2019 | Gandhi |
| 2020/0411482 | A1 | 12/2020 | Gandhi |

FOREIGN PATENT DOCUMENTS

| | | |
|---|---|---|
| CN | 104718611 A | 6/2015 |
| CN | 105244311 A | 1/2016 |
| JP | 2011249563 A | 12/2011 |
| JP | 2012119685 A | 6/2012 |
| TW | I279890 B | 4/2007 |
| WO | 2011148444 A1 | 12/2011 |

OTHER PUBLICATIONS

Supplementary European Search Report in the European application No. 21847280.1, mailed on Jul. 27, 2023. 12 pages.

Written Opinion of the International Search Authority in the international application No. PCT/CN2021/106570, mailed on Oct. 20, 2021. 6 pages with English translation.

First Office Action of the Japanese application No. 2022-562361, issued on Jan. 9, 2024. 8 pages with English translation.

International Search Report in the international application No. PCT/CN2021/106570, mailed on Oct. 20, 2021.

* cited by examiner

US 12,218,032 B2

SEMICONDUCTOR APPARATUS AND MANUFACTURING METHOD THEREOF, AND THREE-DIMENSIONAL INTEGRATED CIRCUIT

CROSS-REFERENCE TO RELATED APPLICATIONS

This is a continuation of International Patent Application No. PCT/CN2021/106570 filed on Jul. 15, 2021, which claims priority to Chinese Patent Application No. 202010699333.3 filed on Jul. 20, 2020. The disclosures of the above-referenced applications are hereby incorporated by reference in their entirety.

BACKGROUND

At present, with the development of science and technology, the three-dimensional integrated circuit can achieve high transmission speeds and chip level miniaturization packaging, meeting the light and thin trend of portable electronic products, and thus has attracted more and more attention.

The information disclosed above by the background art is merely used for enhancing the understanding of the background of this disclosure, and therefore, it may include information of the prior art known by a person having ordinary skill in the art.

SUMMARY

This disclosure relates to the technical field of semiconductors, and in particular, to a semiconductor apparatus, a method for manufacturing a semiconductor apparatus, and a three-dimensional integrated circuit including the semiconductor apparatus.

The purpose of this disclosure is to overcome the disadvantages of the prior at and provide a semiconductor apparatus, a method for manufacturing a semiconductor apparatus, and a three-dimensional integrated circuit including the semiconductor apparatus.

According to an aspect of this disclosure, provided is a semiconductor apparatus, including:
- a substrate, provided with a groove on the substrate; and
- a through silicon via (TSV) structure, disposed on the substrate, a first end of the TSV structure being exposed in the groove, and a distance between an end surface of the first end and a bottom wall of the groove being smaller than the depth of the groove.

In an exemplary embodiment of this disclosure, a method for manufacturing a semiconductor apparatus may include:
- a substrate is provided, and a TSV structure is disposed on the substrate; and
- the substrate is patterned to form a groove, such that a first end of the TSV structure is exposed in the groove, and a distance between an end surface of the first end and a bottom wall of the groove is smaller than the depth of the groove.

It should be understood that the above general description and the following detailed description are only exemplary and explanatory, and cannot limit this disclosure.

BRIEF DESCRIPTION OF THE DRAWINGS

The accompanying drawings, which are incorporated herein and constitute a part of the specification, illustrate embodiments consistent with this disclosure and, together with the specification, serve to explain the principles of the embodiments of this disclosure. Apparently, the accompanying drawings in the following description show merely some embodiments of this disclosure, and a person of ordinary skill in the art may obtain other accompanying drawings from these accompanying drawings without creative efforts.

DETAILED DESCRIPTION

Figure 1:
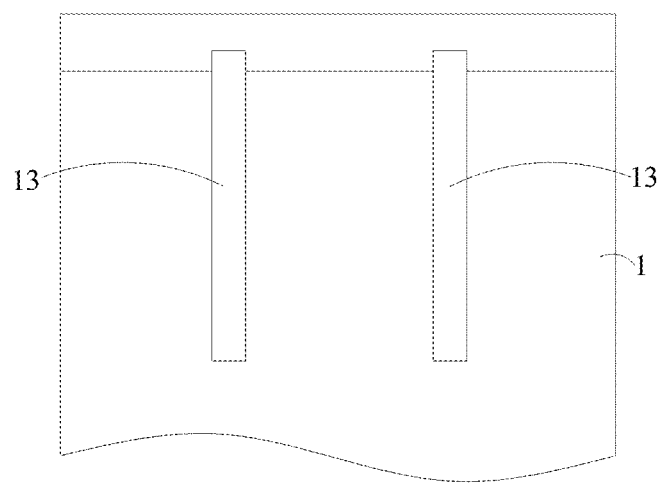
FIG. 1 is a structural schematic diagram of a semiconductor apparatus in some implementations.

Exemplary implementations are described more fully now with reference to the accompanying drawings. However, the exemplary implementations can be implemented in multiple forms, an cannot be understood as to be limited to the implementations elaborated herein. On the contrary, providing these implementations enables this disclosure to be comprehensive and complete and the conception of the exemplary implementations are comprehensively delivered to a person skilled in the art. The same reference numerals in the drawings represent the same or similar structures, and thus detailed description thereof would be omitted.

Because the heat dissipation effect of the multi-chip packages thereof is relatively poor, the usage range thereof is limited.

Various embodiments of the present disclosure provide a semiconductor apparatus, a method for manufacturing a semiconductor apparatus, and a three-dimensional integrated circuit including the semiconductor apparatus.

Figure 2:
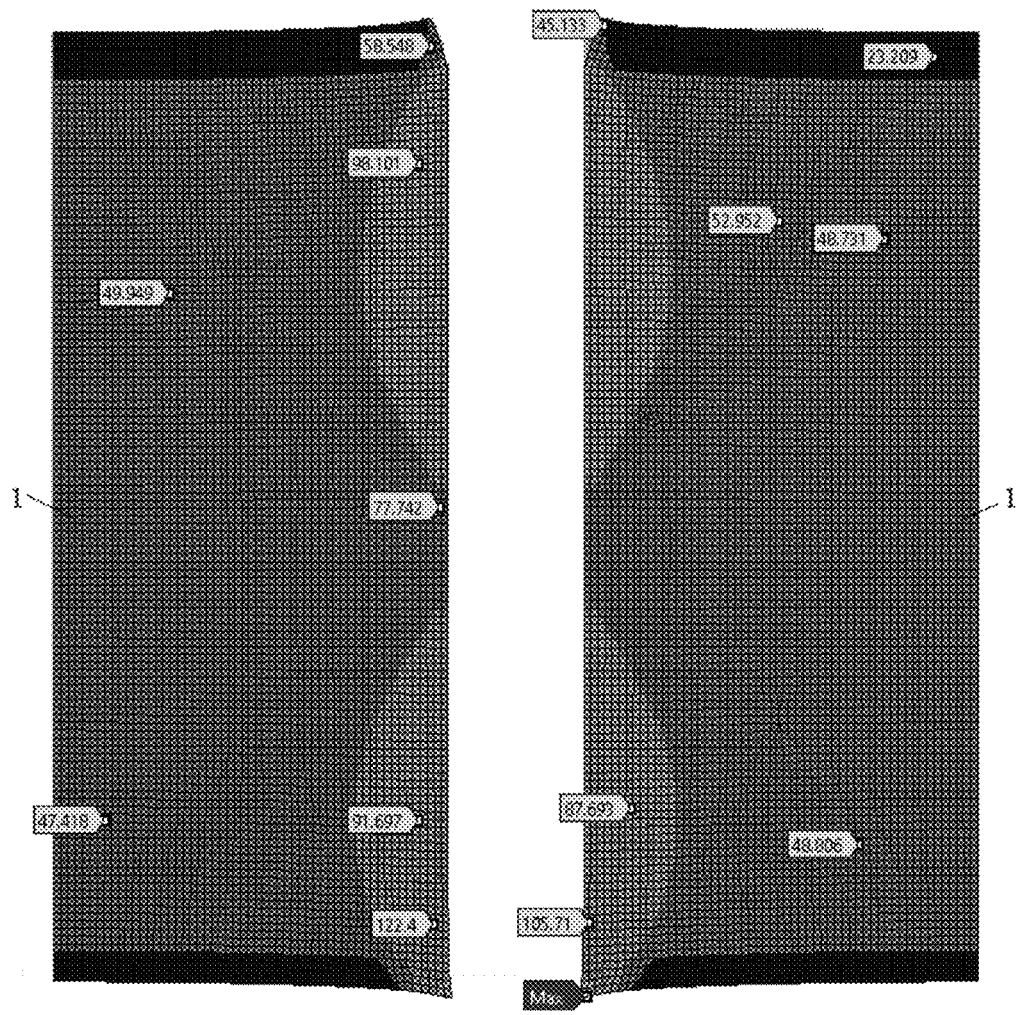
FIG. 2 is a schematic diagram of stress simulation of a base substrate in FIG. 1.

With reference to the structural schematic diagram of the semiconductor apparatus in some implementations as shown in FIG. 1, to enhance the heat dissipation effect of the multi-chip packages, some products adopt setting some dummy TSV structures 13 on the base substrate 1 as assistants, setting the material of the base substrate 1 to be silicon, and conducting heat through a cylindrical metal of the dummy TSV structures 13. However, the pure dummy TSV structures 13 has no prominent heat dissipation effect at the end. With reference to the schematic diagram of stress simulation of a base substrate in FIG. 1 as shown in FIG. 2, the numbers in the drawings represent stress at each spot in the base substrate 1. Since the coefficient of thermal expansion of the metal itself of the dummy TSV structure 13 is far greater than that of the base substrate 1, if the heat dissipation efficiency of the chip is poor, it can cause the thermal expansion of the dummy TSV structure 13 to apply stress on the base substrate 1, so as to cause deformation of the base substrate 1 and the integrated structure as well as drifting of component characteristics.

Figure 3:
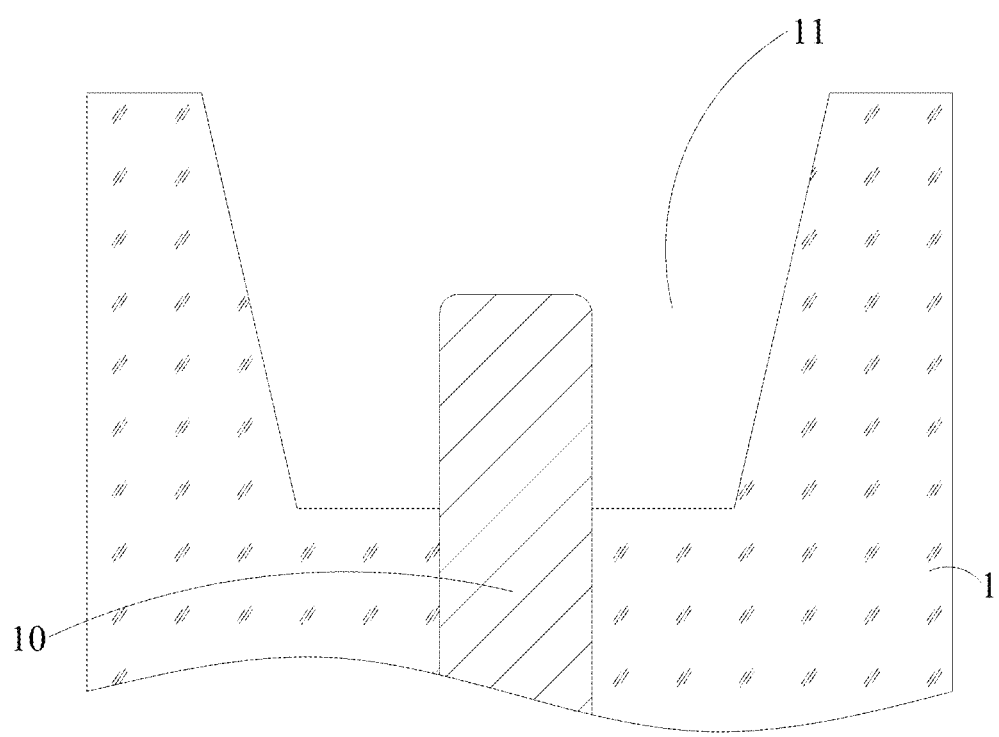
FIG. 3 is a structural schematic diagram of a first exemplary implementation of a semiconductor apparatus of this disclosure.

Various embodiments of the present disclosure first provide a semiconductor apparatus. As shown in FIG. 3, the semiconductor apparatus can include a substrate and a TSV structure 10; the TSV structure 10 is also a dummy TSV structure 13. The TSV structure 10 mentioned below is also a dummy TSV structure 13. A groove is disposed on the substrate; the TSV structure 10 is disposed on the substrate; and a first end of the TSV structure 10 is exposed in the groove, and a distance between an end surface of the first end and a bottom wall of the groove is smaller than the depth of the groove.

In some exemplary implementations of this disclosure, the substrate can be a base substrate 1 and the material can be silicon. A first groove 11 is disposed on the base substrate 1; and a first end of the TSV structure 10 is exposed in the first groove 11, i.e., a distance between an end surface of the first end of the TSV structure 10 and a bottom wall of the first groove 11 is smaller than the depth of the first groove 11, such that the first end is sunken in the base substrate 1.

Figure 4:
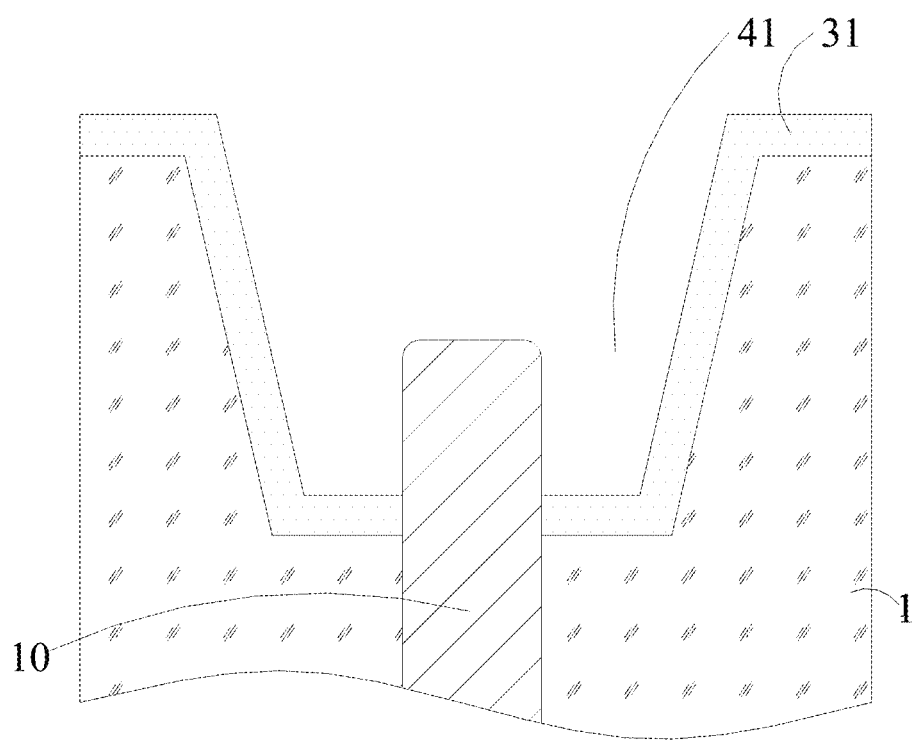
FIG. 4 is a structural schematic diagram of a second exemplary implementation of a semiconductor apparatus of this disclosure.

In some other exemplary implementations of this disclosure, as shown in FIG. 4, the substrate can include a base substrate 1 and a first insulation layer 31. The base material 1 can be a silicon substrate. A first groove 11 is disposed on the base substrate 1; and a first end of the TSV structure 10 is exposed in the first groove 11, i.e., a distance between an end surface of the first end of the TSV structure 10 and a bottom wall of the first groove 11 is smaller than the depth of the first groove 11, such that the first end is sunken in the base substrate 1. The first insulation layer 31 is disposed on the base substrate 1; the first insulation layer 31 is provided with a first blind hole 41 concentric with the first groove 11. The first end of the TSV structure 10 exposed to the base substrate 1 and protruding out of the bottom wall of the first blind hole 41, i.e., a portion of the first end of the TSV structure 10 is exposed to the first insulation layer 31, such that the bottom of the first blind hole 41 is formed as a ring shape. The distance between the end surface of the first end of the TSV structure 10 and the bottom wall of the first blind hole 41 is smaller than the depth of the first blind hole 41.

Figure 5:
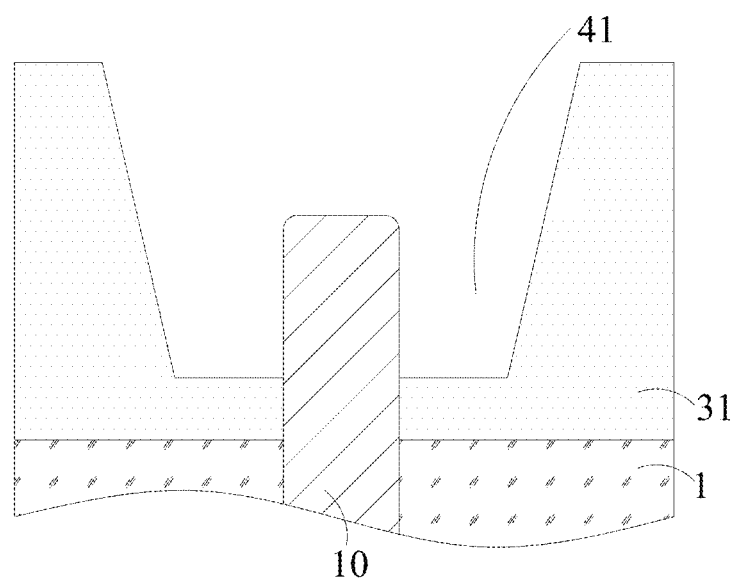
FIG. 5 is a structural schematic diagram of a third exemplary implementation of a semiconductor apparatus of this disclosure.

In addition, in some other exemplary implementations of this disclosure, as shown in FIG. 5, the substrate can include the base substrate 1 and the first insulation layer 31. The base material 1 can be a silicon substrate. The first end of the TSV structure 10 projects out of the base substrate 1, i.e., the first end of the TSV structure 10 is exposed to the base substrate 1 since it projects out of the base substrate 1. The first insulation layer 31 is disposed on the base substrate 1; the first insulation layer 31 is provided with a first blind hole 41; and the first blind hole 41 makes at least a portion of the first end of the TSV structure 10 exposed to the base substrate 1 exposed to the first insulation layer 31. The thickness of the first insulation layer 31 in this exemplary implementation is greater than that in FIG. 4; the thickness of the first insulation layer 31 is greater than the height of the first end of the TSV structure 10 exposed to the base substrate 1, such that the distance between the end surface of the exposed first end of the TSV structure 10 and the bottom wall of the first blind hole 41 is smaller than the depth of the first blind hole 41.

The first end of the TSV structure 10 is exposed so as to facilitate heat dissipation; the distance between the end surface of the first end and the bottom wall of the groove is smaller than the depth of the groove, i.e., the first end of the TSV structure 10 is sunken in the groove, and other structures will not be affected.

In some other exemplary implementations, the semiconductor apparatus can further include a heat conductive layer group and a heat dissipation layer group; the heat conductive layer group is disposed in the first blind hole 41; the heat conductive layer group is at least in contact with the end surface of the first end of the TSV structure 10; a thickness of the heat conductive layer group decreases with an increase of a distance from the end surface of the first end; and the heat dissipation layer group is connected to the heat conductive layer group and extends towards a side distal from the TSV structure 10.

For example, the heat conductive layer group can be set as three layers, i.e., the first heat conductive layer 61, the second heat conductive layer 62, and the third heat conductive layer 63. The heat dissipation layer group can also be set as three layers, i.e., the first heat dissipation layer 71, the second heat dissipation layer 72, and the third heat dissipation layer 73. An insulation layer is disposed between two adjacent heat conductive layers and heat dissipation layers.

Figure 6:
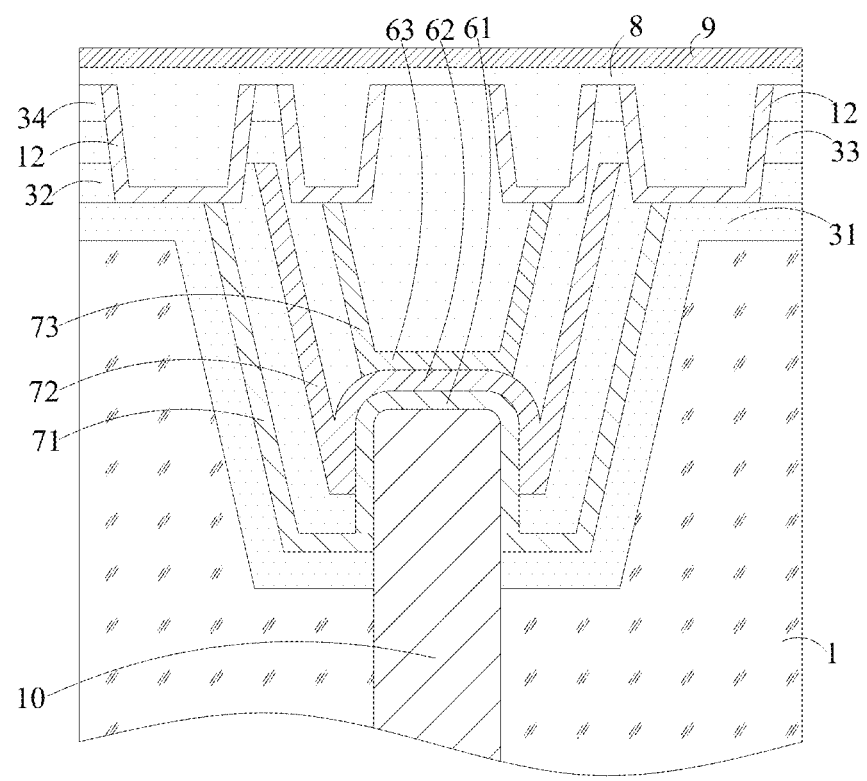
FIG. 6 is a structural schematic diagram of a fourth exemplary implementation of a semiconductor apparatus of this disclosure.
Figure 7:
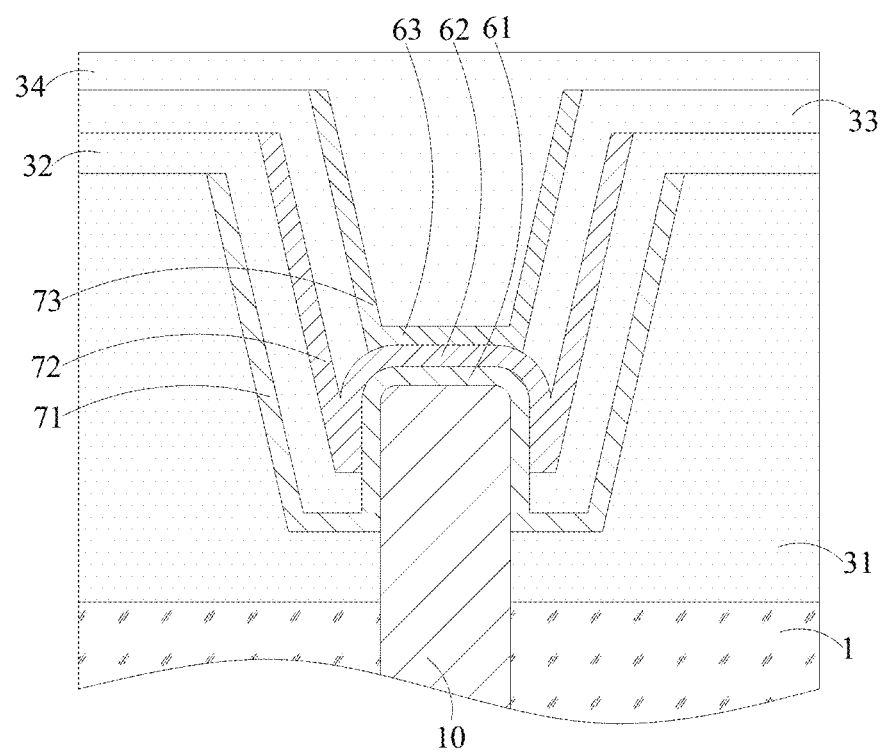
FIG. 7 is a structural schematic diagram of a fifth exemplary implementation of a semiconductor apparatus of this disclosure.

As shown in FIG. 6 and FIG. 7, specifically, the first heat conductive layer 61 can be set in a cylindrical shape with a bottom; the depth of the first heat conductive layer 61 is the same as the length of the TSV structure 10 exposed to the first insulation layer 31. The first heat conductive layer 61 is sleeved on the first end of the TSV structure 10, i.e., the first heat conductive layer 61 is sleeved at the end of the first end of the TSV structure 10 exposed to the first insulation layer 31; the bottom wall of the first heat conductive layer 61 is in contact with the end surface of the first end of the TSV structure 10; the sidewall of the first heat conductive layer 61 is in contact with the side surface of the TSV structure 10. The first heat conductive layer 61 completely covers the portion of the TSV structure 10 exposed to the first insulation layer 31.

The first heat dissipation layer 71 is connected to an edge of a cylinder wall of the first heat conductive layer 61. The first heat dissipation layer 71 can be set in a cylindrical shape with a ring, i.e., the first heat dissipation layer 71 can include a first heat dissipation ring and a first heat dissipation cylinder. The first heat dissipation ring is located at the bottom wall of the first blind hole 41; an inner ring surface of the first heat dissipation ring is connected to an edge of the cylinder wall of the first heat conductive layer 61; an outer ring surface of the first heat dissipation ring is connected to the first heat dissipation cylinder; the first heat dissipation cylinder is located at a side of the first insulation layer 31 distal from the base substrate 1. The first heat dissipation cylinder extends towards a side distal from the TSV structure 10.

The second insulation layer 32 is disposed at a side of the first heat dissipation layer 71 proximal to the TSV structure 10. The second insulation layer 32 does not completely cover the first heat conductive layer 61, and merely covers the end of the first heat conductive layer 61 connected to the first heat dissipation layer 71; certainly, under the condition that the first heat dissipation ring is set to be relatively wide, the second insulation layer 32 can also be completely disconnected to the first heat conductive layer 61. The second insulation layer 32 can also be disposed on the side of the first insulation layer 31 outside the first blind hole 41 distal from the base substrate 1.

A second heat conductive layer 62 is disposed at a side of the first heat conductive layer 61 distal from the TSV structure 10; the second heat conductive layer 62 is also set in a cylindrical shape with a bottom; the depth of the second heat conductive layer 62 is the same as the length of the first heat conductive layer 61 exposed to the second insulation layer 32. The second heat conductive layer 62 is sleeved on an end of a portion of the first heat conductive layer 61, i.e., the second heat conductive layer 62 is sleeved at the end of the first heat conductive layer 61 exposed to the second insulation layer 32; the bottom wall of the second heat conductive layer 62 is in contact with the bottom wall of the first heat conductive layer 61; the sidewall of the second heat conductive layer 62 is in contact with the sidewall of the first heat conductive layer 61. The second heat conductive layer 62 completely covers the portion of the first heat conductive layer 61 exposed to the second insulation layer 32.

The second heat dissipation layer 72 is connected to an edge of a cylinder wall of the second heat conductive layer 62. The second heat dissipation layer 72 can be disposed as a cylindrical shape, i.e., the cylinder wall of the second heat dissipation layer 72 is connected to a cylinder wall of the second heat conductive layer 62; and the second heat dissipation layer 72 is located at a side of the second insulation layer 32 proximal to the TSV structure 10. The second heat dissipation layer 72 extends towards a side distal from the TSV structure 10.

The third insulation layer 33 is located at a side of the second heat dissipation layer 72 proximal to the TSV structure 10. That is, the third insulation layer 33 does not completely cover the second heat conductive layer 62, and merely covers the end of the second heat conductive layer 62 connected to the second heat dissipation layer 72, such that the bottom wall of the second heat conductive layer 62 is exposed to the third insulation layer 33. Certainly, under the condition that the first heat dissipation ring is set to be relatively wide, a portion of the sidewall and bottom wall of the second heat conductive layer 62 can also be exposed to the third insulation layer 33. The third insulation layer 33 can also be disposed on the side of the second insulation layer 32 outside the first blind hole 41 distal from the base substrate 1.

A third heat conductive layer 63 is disposed at a side of the second heat conductive layer 62 distal from the TSV structure 10; the third heat conductive layer 63 is set in a sheet shape; the third heat conductive layer 63 is in contact with the bottom wall of the second heat conductive layer 62; the third heat conductive layer 63 completely covers a portion of the third heat conductive layer 62 exposed to the third insulation layer 33.

The third heat dissipation layer 73 can be set in a cylindrical shape; the third heat dissipation layer 73 is connected to the edge of the third heat conductive layer 63 and is located at a side of the third insulation 33 distal from the base substrate 1; the third heat dissipation layer 73 extends towards a side distal from the TSV structure 10, i.e., the edge of the third heat dissipation layer 73 proximal to the TSV structure 10 is connected to the edge of the third heat conductive layer 63.

The heat conductive layer group in a multi-layer setting makes the thickness of the heat conductive layer of the end surface of the first end of the TSV structure 10 the thickest. The closer to the end surface of the first end of the TSV structure 10, the thicker the thickness of the heat conductive layer, so as to accelerate the heat energy guide effect, and improve the heat dissipation capability of relatively edge regions of the TSV structure 10.

Figure 8:
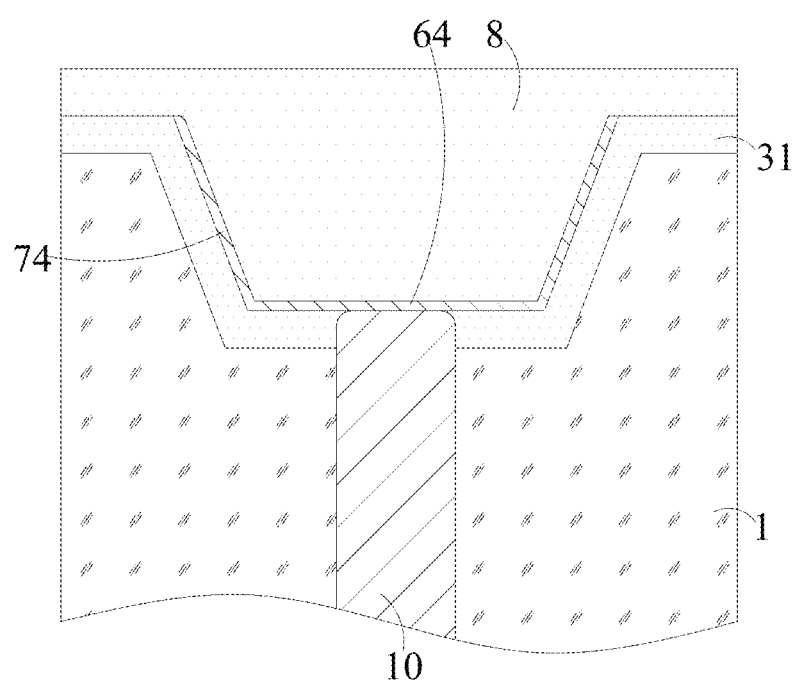
FIG. 8 is a structural schematic diagram of a sixth exemplary implementation of a semiconductor apparatus of this disclosure.

In addition, as shown in FIG. 8, in this exemplary implementation, the end surface of the first end of the TSV structure 10 is exposed to the first insulation layer 31, i.e., the depth of the first blind hole 41 on the first insulation layer 31 is smaller than the depth of the first blind hone 41 in the exemplary implementations shown in FIG. 6 and FIG. 7. In the exemplary implementation shown in FIG. 8, only one heat conductive layer 64 and one heat dissipation layer 74 are disposed, which are respectively the heat conductive layer 64 and the heat dissipation layer 74. Specifically, the heat conductive layer 64 is set in a sheet shape; the heat conductive layer 64 is in contact with the end surface of the first end of the TSV structure 10 exposed to the first insulation layer 31; the heat dissipation layer 74 is connected to the edge of the heat conductive layer 64; the heat dissipation layer 74 is located at a side of the first insulation layer 31 proximal to the TSV structure 10. The heat dissipation layer 74 can be set in a cylindrical shape; the heat dissipation layer 74 extends towards a side distal from the TSV structure 10, i.e., the edge of the heat dissipation layer 74 proximal to the TSV structure 10 is connected to the edge of the heat conductive layer 64.

The materials for the first heat conductive layer 61, the second heat conductive layer 62, the third heat conductive layer 63, the heat conductive layer 64, the first heat dissipation layer 71, the second heat dissipation layer 72, the third heat dissipation layer 73, and the heat dissipation layer 74 can be tungsten, aluminum, copper, gold, silver, or semiconductor metals and combinations thereof, and can also be other non-metal semiconductor materials which own excellent thermal conductivity and combinations thereof; moreover, the materials thereof can be the same or can be different.

The materials for the first insulation layer 31, the second insulation layer 32, and the third insulation layer 33 can be insulation materials having excellent thermal conductivity or insulation materials mixed with heat conductive metal or metal oxide particles; moreover, the materials thereof can be the same or can be different.

It is to be explained that the structures of the heat conductive layer group and the heat dissipation layer group are not limited to the explanations above, for example, the heat conductive layer group and the heat dissipation layer group can both be set as two layers, and can also be set as four, five, or more layers.

As shown in FIG. 6 continuously, the semiconductor apparatus can further include four radiation fins 12, each radiation fin 12 is disposed as a cylindrical shape with a bottom having a bottom wall and a sidewall, the bottom wall is connected to an end of the heat dissipation layer group distal from the TSV structure 10, and the sidewall extends towards a side distal from the TSV structure 10. The heat dissipation area is increased through the radiation fins 12, so as to enhance the heat dissipation effect. Certainly, the number of the radiation fins 12 can be set according to needs.

Figure 9:
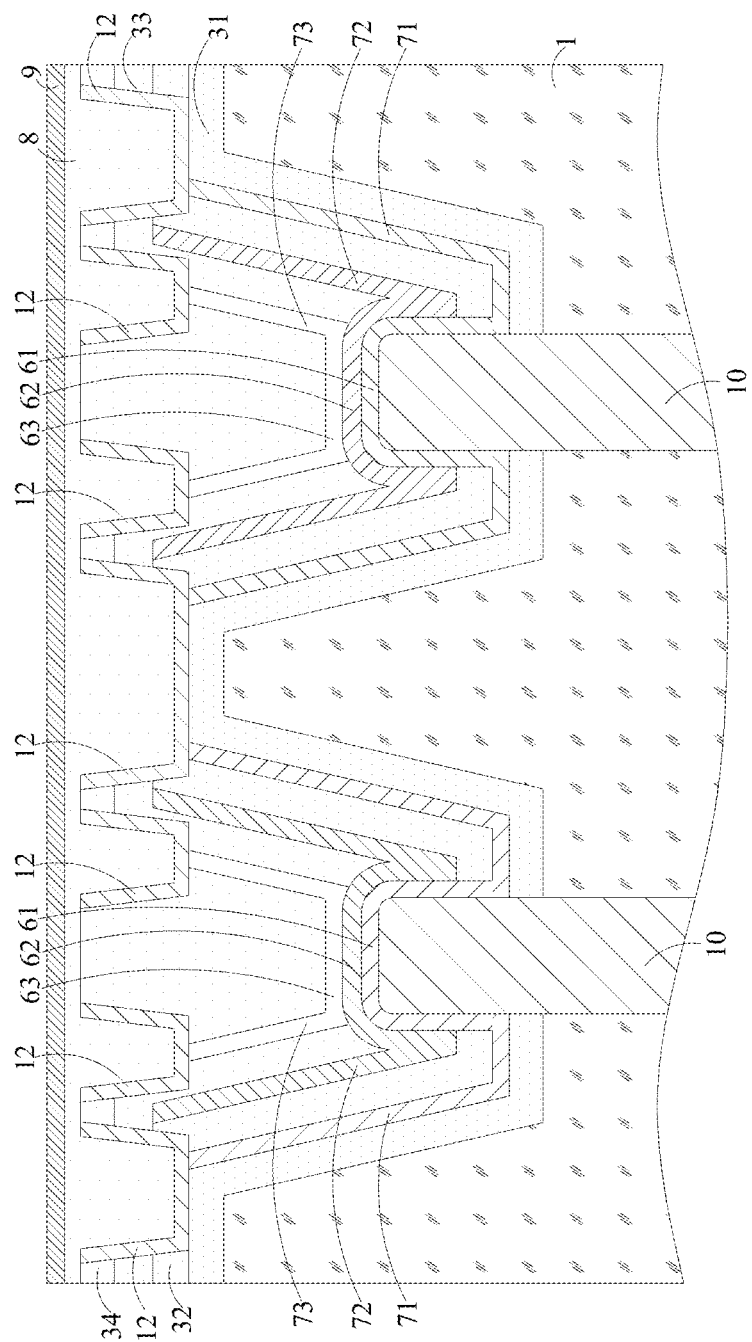
FIG. 9 is a structural schematic diagram of a seventh exemplary implementation of a semiconductor apparatus of this disclosure.

As shown in FIG. 9, at least one radiation fin 12 is connected between the heat dissipation layer groups of two adjacent TSV structures 10, i.e., one radiation fin 12 is connected to the first heat dissipation layer 71 of one TSV structure 10, and is also connected to the first heat dissipation layer 71 of another adjacent TSV structure 10. The heat dissipation layer groups of the two adjacent TSV structures 10 are connected through the radiation fin 12, and the heat dissipation uniformity of the TSV structure 10 is increased.

Figure 10:
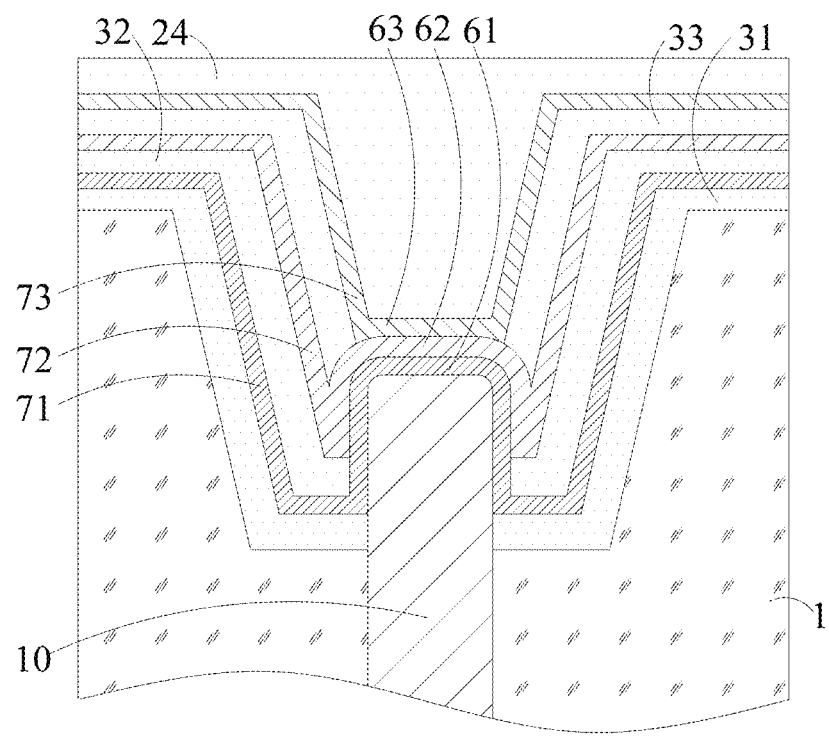
FIG. 10 is a structural schematic diagram of an eighth exemplary implementation of a semiconductor apparatus of this disclosure.
Figure 11:
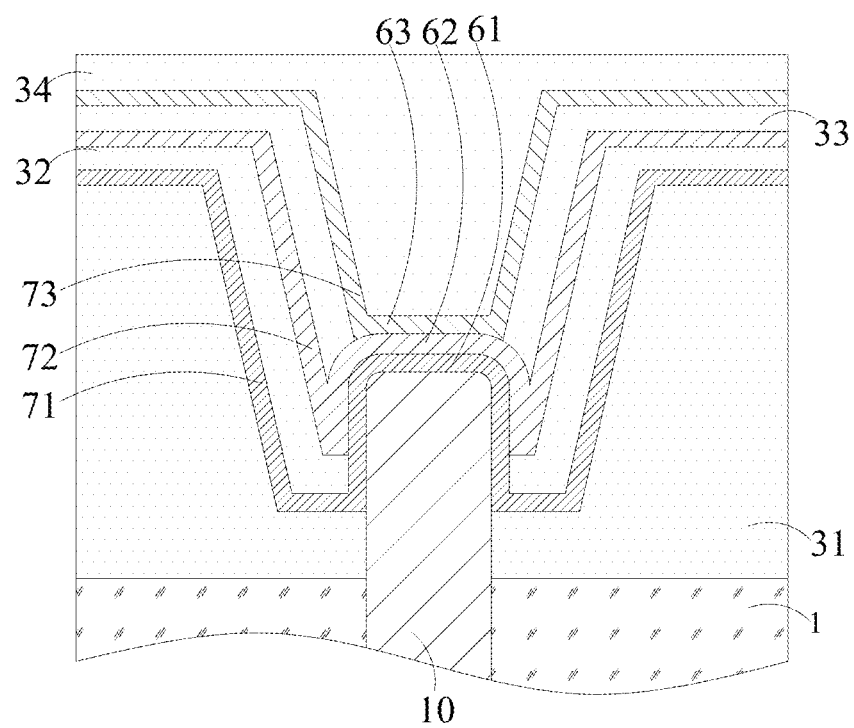
FIG. 11 is a structural schematic diagram of a ninth exemplary implementation of a semiconductor apparatus of this disclosure.

As shown in FIG. 10 and FIG. 11, the first heat conductive material layer 51 on the first insulation layer 31 outside the first blind hole 41 cannot be removed, such that the first heat conductive layer 61 can also be formed on the first insulation layer 31 outside the first blind hole 41; the second heat conductive material layer 52 on the second insulation layer 32 outside the second blind hole 42 cannot be removed, such that the second heat conductive layer 62 can also be formed on the second insulation layer 32 outside the second blind hole 42; the third heat conductive material layer on the third insulation layer 33 outside the third blind hole cannot be removed, such that the third heat conductive layer 63 can also be formed on the third insulation layer 33 outside the third blind hole.

The semiconductor apparatus can further include a dielectric layer 8 and a metal barrier layer 9. The dielectric layer 8 is disposed at a side of the heat dissipation layer group distal from the TSV structure 10; and the metal barrier layer 9 is disposed at a side of the dielectric layer 8 distal from the TSV structure 10. The dielectric layer 8 and the metal barrier layer 9 prevent the risk of additional leakage and metal contamination. The material of the metal barrier layer 9 is Ti, TiN, Ta, TaN, Cu, or a copper alloy.

Furthermore, this exemplary implementation further provides a three-dimensional integrated circuit. The three-dimensional integrated circuit can include the semiconductor apparatus according to any one of the implementations above. The specific structure of the semiconductor apparatus is explained in detail above, and thus is omitted for conciseness.

As compared with the prior art, the beneficial effects of the three-dimensional integrated circuit provided by the embodiments of this disclosure are the same as the beneficial effects of the semiconductor apparatus provided by the embodiments above, and thus are omitted for conciseness.

Figure 12:
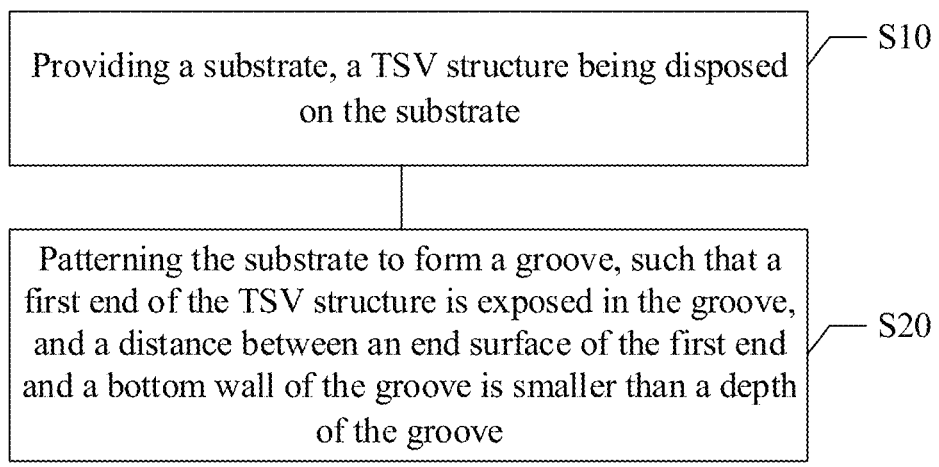
FIG. 12 is a flow schematic diagram of an exemplary implementation of a method for manufacturing a semiconductor apparatus of this disclosure.

Furthermore, this exemplary implementation further provides a method for manufacturing a semiconductor apparatus. As shown in FIG. 12, The method for manufacturing a semiconductor apparatus can include the following steps.

At step S10, a substrate is provided, and a TSV structure 10 is disposed on the substrate.

At step S20, the substrate is patterned to form a groove, such that a first end of the TSV structure 10 is exposed in the groove, and a distance between an end surface of the first end and a bottom wall of the groove is smaller than the depth of the groove.

Each step of the method for manufacturing a semiconductor apparatus is explained in detail below.

In this exemplary implementation, as shown in FIG. 3, a base substrate 1 is provided; a first groove 11 is disposed on the base substrate 1; and a first end of the TSV structure 10 is exposed in the first groove 11, and a distance between an end surface of the first end and a bottom wall of the first groove 11 of the TSV structure 10 is smaller than the depth of the first groove 11.

Figure 13:
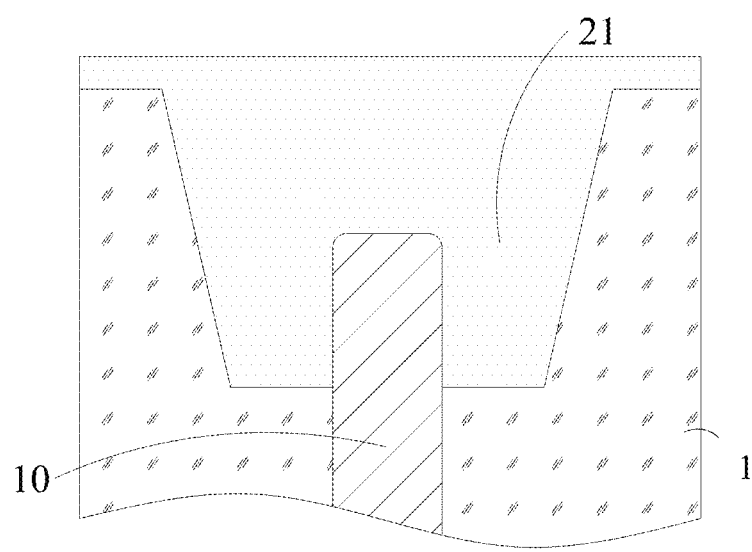
FIG. 13 is a first structural schematic diagram of a step of an exemplary implementation of a method for manufacturing a semiconductor apparatus of this disclosure.

As shown in FIG. 13, a first insulation material layer 21 is formed on the base substrate 1. The first insulation material layer 21 fills the first groove 11 on the base substrate 1. As shown in FIG. 4, the first insulation material layer 21 is patterned to form the first insulation layer 31 and the first blind hole 41 concentric with the first groove 11; the first blind hole 41 makes a portion of the first end of the TSV structure 10 exposed to the first insulation layer 31; and the first insulation layer 31 covers a groove wall of the first groove 11 and the base substrate 1.

In some other exemplary implementations of this disclosure, the manufacturing method can further include: forming a heat conductive layer group and a heat dissipation layer group, the heat conductive layer group being in the first blind hole 41, the heat conductive layer group being at least in contact with the end surface of the first end of the TSV structure 10, a thickness of the heat conductive layer group decreasing with an increase of a distance from the end surface of the first end, and the heat dissipation layer group being connected to the heat conductive layer group and extending towards a side distal from the TSV structure 10.

Figure 14:
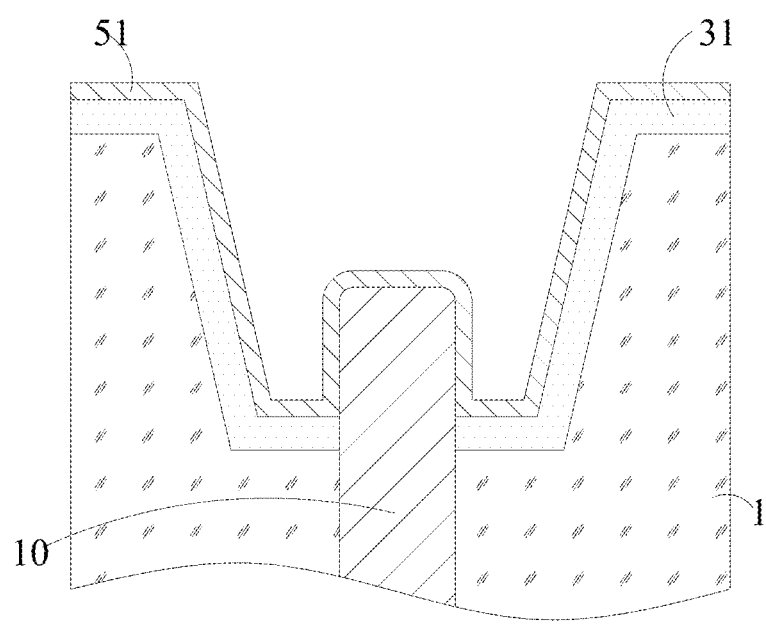
FIG. 14 is a second structural schematic diagram of a step of an exemplary implementation of a method for manufacturing a semiconductor apparatus of this disclosure.
Figure 15:
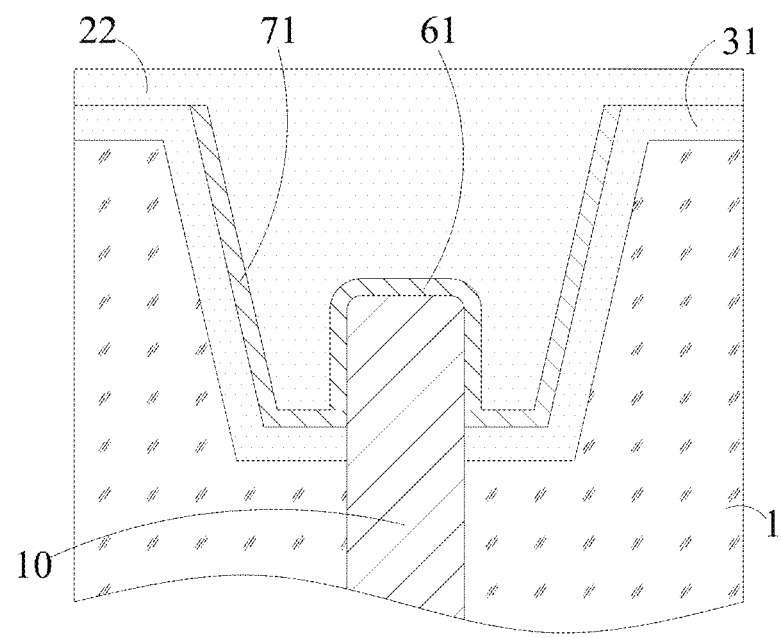
FIG. 15 is a third structural schematic diagram of a step of an exemplary implementation of a method for manufacturing a semiconductor apparatus of this disclosure.

Specifically, as shown in FIG. 14, the first heat conductive material layer 51 is formed at the first end of the TSV structure 10 and the first insulation layer 31 through evaporation, sputtering, and other processes. As shown in FIG. 15, the first heat conductive material layer 51 is patterned to remove the first heat conductive material layer 51 on the first insulation layer 31 outside the first blind hole 41 to form the first heat conductive layer 61 and the first heat dissipation layer 71. The first heat conductive layer 61 is formed as a cylindrical shape with a bottom and sleeved at the first end of the TSV structure 10. The first heat dissipation layer 71 is formed as a cylindrical shape; the first heat dissipation layer 71 is connected to an edge of a cylinder wall of the first heat conductive layer 61; and the first heat dissipation layer 71 is located at a side of the first insulation layer 31 proximal to the TSV structure 10. The specific structures of the first heat conductive layer 61 and the first heat dissipation layer 71 are explained in detail above, and thus are omitted for conciseness. Next, the second insulation material layer 22 is formed at a side of the first heat conductive layer 61 distal from the base substrate, a side of the first heat dissipation layer 71 distal from the base substrate, and the side of the first insulation layer 31 distal from the base substrate 1 through the planarization processes.

Figure 16:
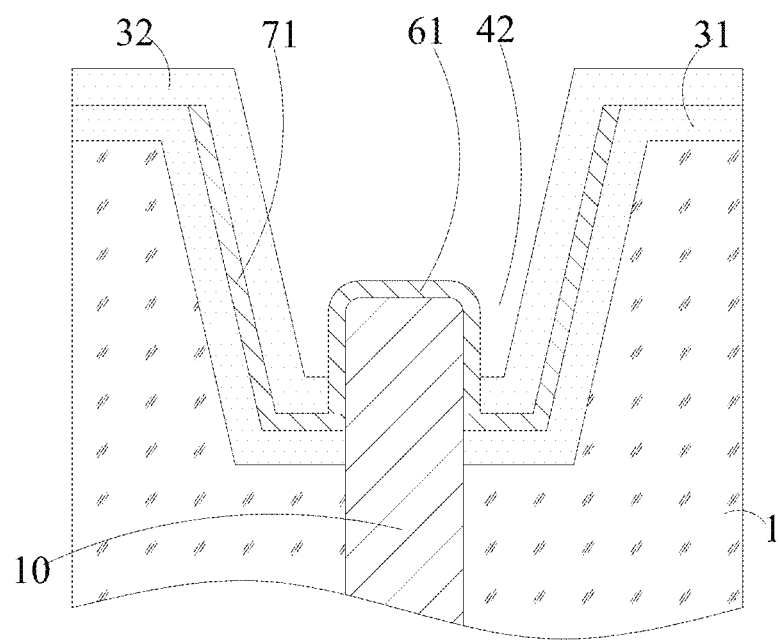
FIG. 16 is a fourth structural schematic diagram of a step of an exemplary implementation of a method for manufacturing a semiconductor apparatus of this disclosure.

As shown in FIG. 16, a second blind hole and a second insulation layer 32 are formed by patterning the second insulation material layer 22; the orthogonal projection of the second blind hole on the base substrate 1 is at least partially overlapped with the orthogonal projection of the first heat conductive layer 61 on the base substrate 1 so as to expose a portion of the first heat conductive layer 61. That is, the second blind hole 42 and the first blind hole 41 are coaxially set; the second insulation layer 32 completely covers the first heat dissipation layer 71 and only covers the end of the first heat conductive layer 61 connected to the first heat dissipation layer 71.

Figure 17:
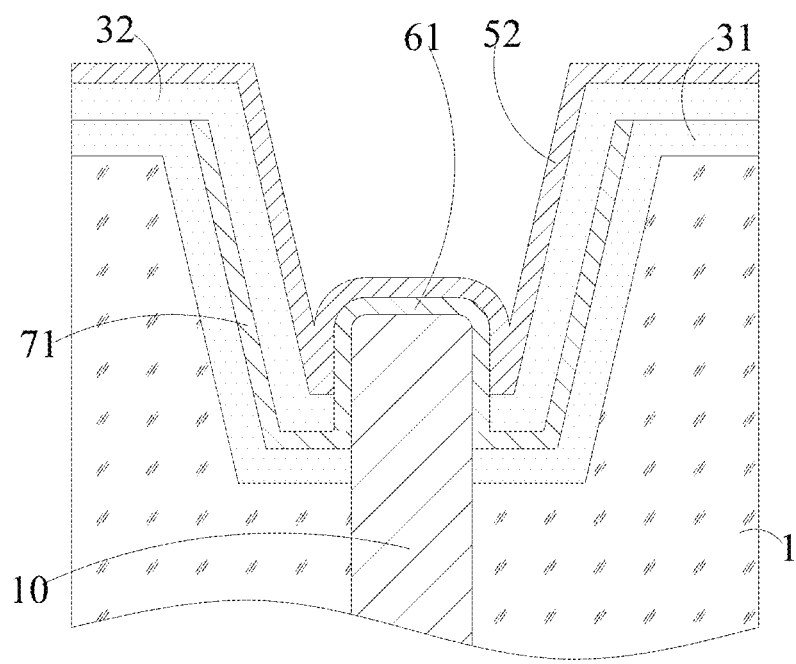
FIG. 17 is a fifth structural schematic diagram of a step of an exemplary implementation of a method for manufacturing a semiconductor apparatus of this disclosure.

As shown in FIG. 17, the second heat conductive material layer 52 is formed at a side of the second insulation layer 32 distal from the substrate and the side of the first heat conductive layer 61 distal from the base substrate 1 through evaporation, sputtering, and other processes.

Figure 18:
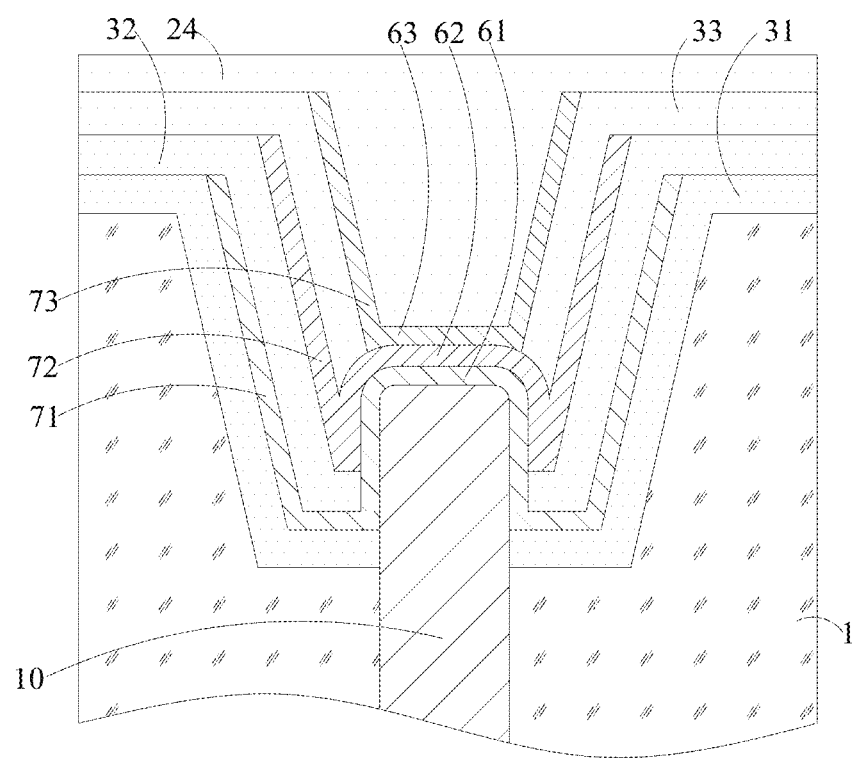
FIG. 18 is a sixth structural schematic diagram of a step of an exemplary implementation of a method for manufacturing a semiconductor apparatus of this disclosure.

As shown in FIG. 18, the second heat conductive material layer 52 is patterned to remove the second heat conductive material layer 52 on the second insulation layer 32 outside the second blind hole 42 to form the second heat conductive layer 62 and the second heat dissipation layer 72; the second heat conductive layer 62 is formed as a cylindrical shape with a bottom and is sleeved at a side of a portion of the first heat conductive layer 61 distal from the TSV structure 10, and the second heat dissipation layer 72 is connected to an edge of a cylinder wall of the second heat conductive layer 62 and located at a side of the second insulation layer 32 distal from the base substrate. The specific structures of the second heat conductive layer 62 and the second heat dissipation layer 72 are explained in detail above, and thus are omitted for conciseness.

The third insulation material layer is formed at a side of the second heat conductive layer 62 distal from the base substrate, a side of the second heat dissipation layer 72 distal from the base substrate, and the side of the second insulation layer 32 distal from the base substrate 1 through planarization process, and the third insulation material layer is patterned to form a third blind hole and a third insulation layer 33; and a orthogonal projection of the third blind hole on the base substrate 1 is at least partially overlapped with a orthogonal projection of the second heat conductive layer 62 on the base substrate so as to expose a portion of the second heat conductive layer 62. That is, the third blind hole and the first blind hole 41 are coaxially set; the third insulation layer 33 completely covers the second heat dissipation layer 72 and only covers the end of the second heat conductive layer 62 connected to the second heat dissipation layer 72.

The third heat conductive material layer is formed at a side of the third insulation layer 33 distal from the substrate and the side of the second heat conductive layer 62 distal from the base substrate 1 through evaporation, sputtering, and other processes; the third heat conductive material layer is patterned to remove the second heat conductive material layer 52 on the third insulation layer 33 outside the third blind hole to form a third heat conductive layer 63 and a third heat dissipation layer 73; the third heat conductive layer 63 is disposed at a side of a portion of the second heat conductive layer 62 distal from the TSV structure 10, and the third heat dissipation layer 73 is connected to an edge of the third heat conductive layer 63 and located at a side of the third insulation layer 33 distal from the substrate. The specific structures of the third heat conductive layer 63 and the third heat dissipation layer 73 are explained in detail above, and thus are omitted for conciseness.

The fourth insulation material layer 24 is formed at a side of the heat dissipation layer group distal from the TSV structure 10 through the planarization process; the fourth insulation material layer 24 completely covers the third heat conductive layer 63 and the third heat dissipation layer 73.

Figure 19:
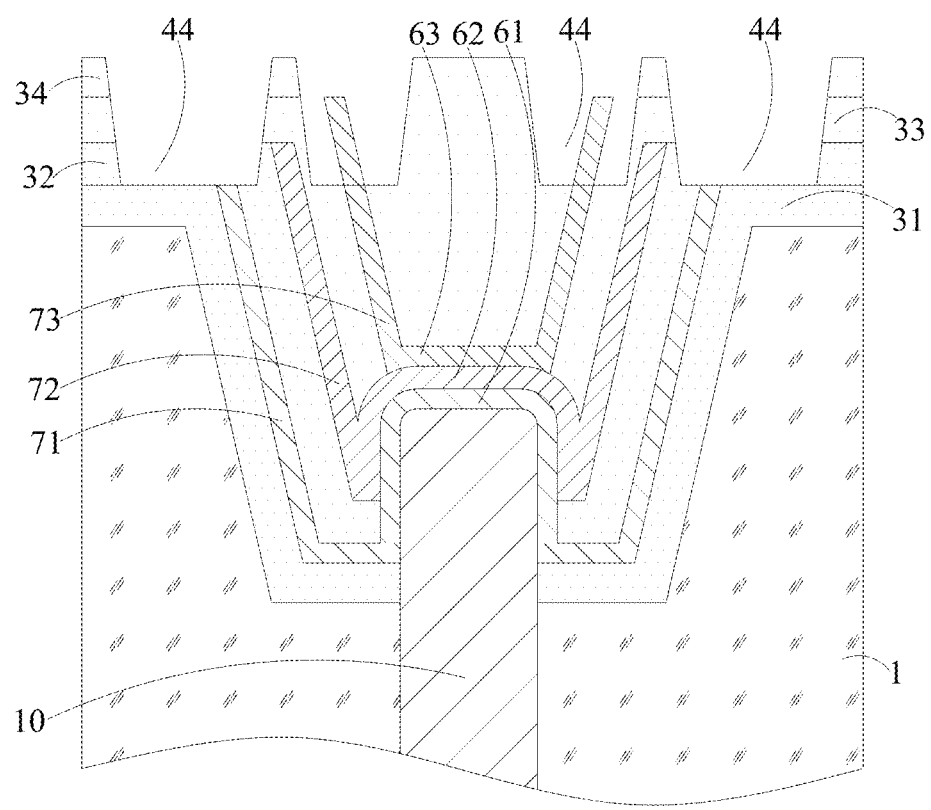
FIG. 19 is a seventh structural schematic diagram of a step of an exemplary implementation of a method for manufacturing a semiconductor apparatus of this disclosure.

As shown in FIG. 19, the fourth insulation material layer 24 is patterned to form the fourth insulation layer 34. When patterning the fourth insulation material layer 24, the etching time is relatively long, such that the second insulation layer 32, the third insulation layer 33, and a portion of the first insulation layer 31 are also etched to form a plurality of fourth blind holes 44; the ends of the first heat dissipation layer 71, the second heat dissipation layer 72, and the third heat dissipation layer 73 distal from the TSV structure 10 are exposed outside the bottom wall of the fourth blind holes 44.

Figure 20:
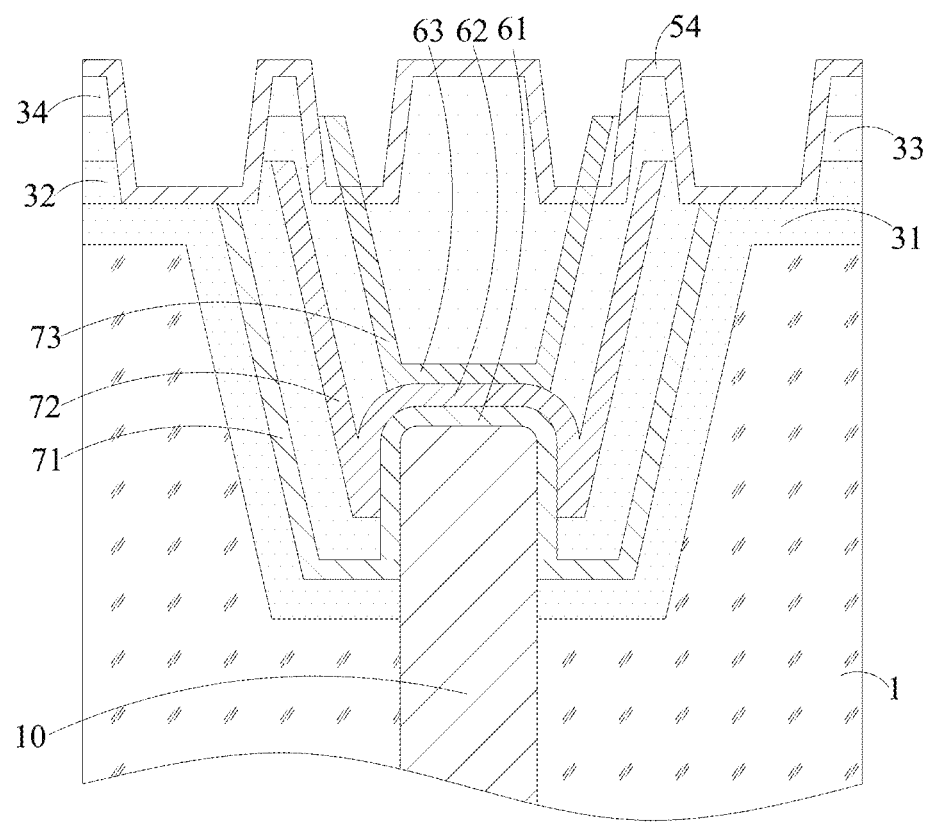
FIG. 20 is an eighth structural schematic diagram of a step of an exemplary implementation of a method for manufacturing a semiconductor apparatus of this disclosure.

As shown in FIG. 20, the fourth heat conductive material layer 54 is formed at a side of the fourth blind hole 44 distal from the TSV structure 10 through evaporation, sputtering, and other processes. As shown in FIG. 6, the fourth heat conductive material layer 54 is patterned to remove the fourth heat conductive material layer 54 outside the fourth blind hole 44 to form a plurality of radiation fins 12; each radiation fin 12 is in a cylindrical shape with a bottom having a bottom wall and a sidewall, the bottom wall is connected to an end of the heat dissipation layer group distal from the TSV structure 10, and the sidewall extending towards a side distal from the TSV structure 10. A dielectric layer 8 is formed at a side of the heat dissipation layer group distal from the TSV structure 10; and a metal barrier layer 9 is formed at a side of the dielectric layer 8 distal from the TSV structure 10.

As shown in FIG. 9, one radiation fin 12 can also be disposed between two adjacent TSV structures 10, such that the radiation fin 12 is connected between the heat dissipation layer groups of the two adjacent TSV structures 10.

Figure 21:
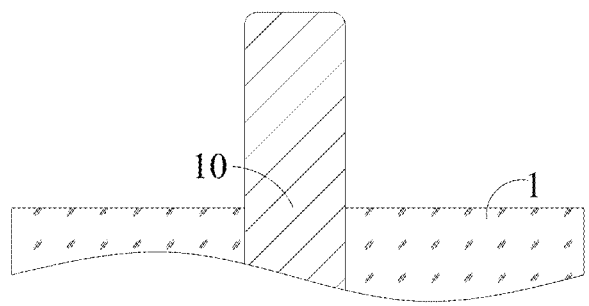
FIG. 21 is a first structural schematic diagram of a step of another exemplary implementation of a method for manufacturing a semiconductor apparatus of this disclosure.
Figure 22:
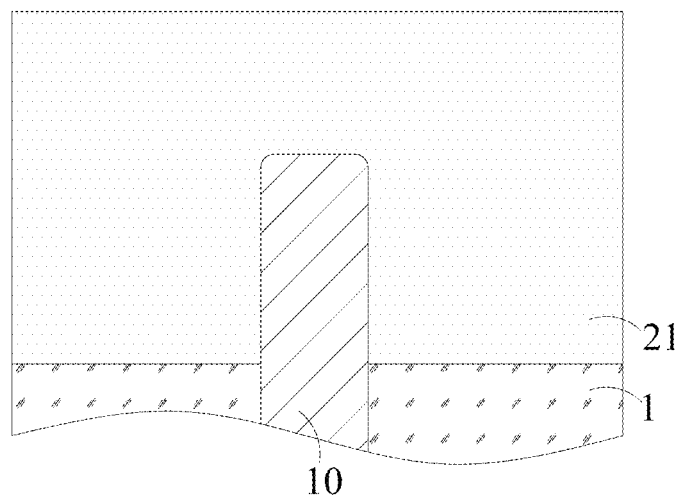
FIG. 22 is a second structural schematic diagram of a step of another exemplary implementation of a method for manufacturing a semiconductor apparatus of this disclosure.

In addition, it is to be explained that the structure of the substrate is not limited to the explanation above, for example, as shown in FIG. 21, a surface of the base substrate 1 is a plane; the first end of the TSV structure 10 projects out of the plane to be exposed outside the base substrate 1. As shown in FIG. 22, the first insulation material layer 21 is formed at the first end of the TSV structure 10 on the base substrate 1 through the planarization process. The thickness of the first insulation material layer 21 is greater than the height of the first end of the TSV structure 10 protruding from the base substrate 1; the first insulation material layer 21 completely covers the first end of the TSV structure 10. As shown in FIG. 8, the first insulation material layer 21 is patterned to form the first blind hole 41 and the first insulation layer 31.

The following methods for forming the heat conductive layer group and the heat dissipation layer group can be same as the methods of the exemplary implementations shown in FIG. 14 to FIG. 18, and the explanation is made by combining with the accompanying drawings below.

Figure 23:
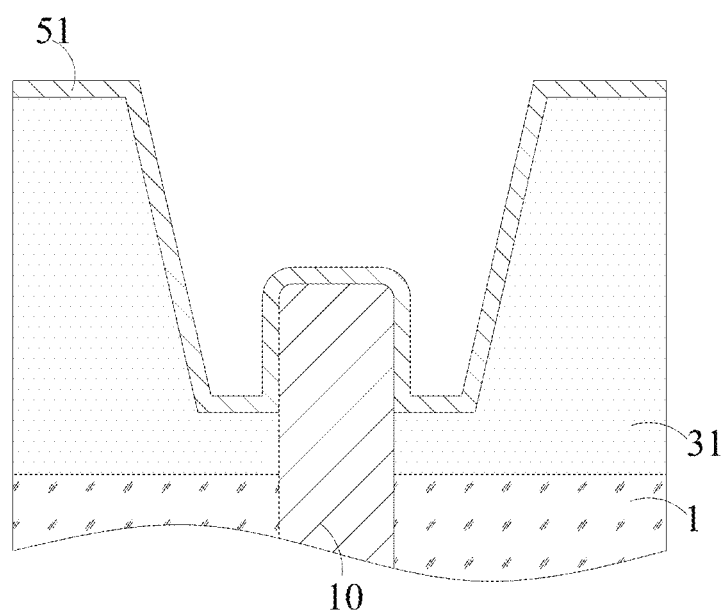
FIG. 23 is a third structural schematic diagram of a step of another exemplary implementation of a method for manufacturing a semiconductor apparatus of this disclosure.
Figure 24:
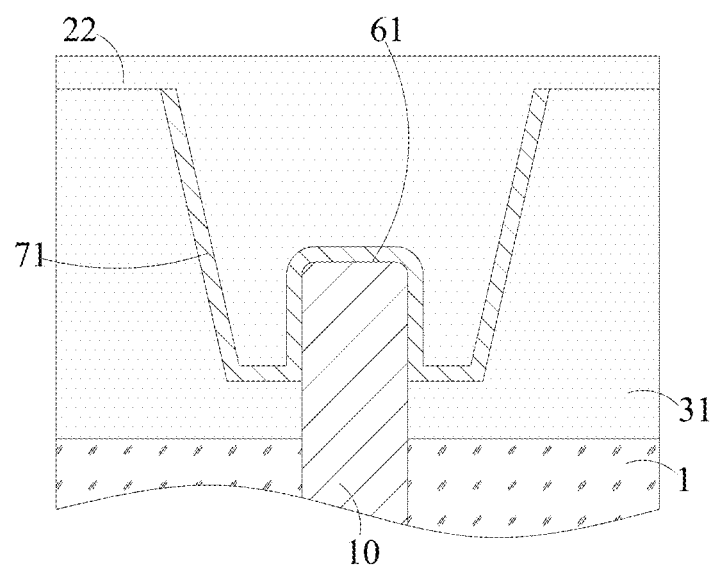
FIG. 24 is a fourth structural schematic diagram of a step of another exemplary implementation of a method for manufacturing a semiconductor apparatus of this disclosure.
Figure 25:
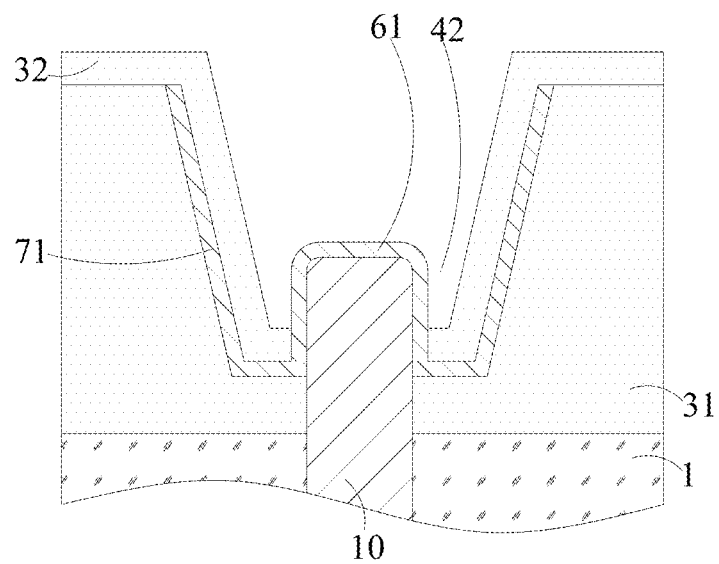
FIG. 25 is a fifth structural schematic diagram of a step of another exemplary implementation of a method for manufacturing a semiconductor apparatus of this disclosure.
Figure 26:
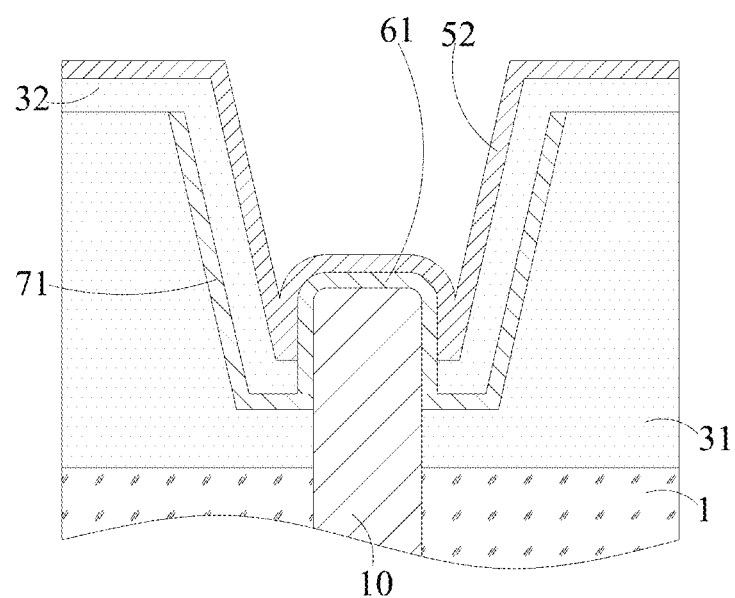
FIG. 26 is a sixth structural schematic diagram of a step of another exemplary implementation of a method for manufacturing a semiconductor apparatus of this disclosure.

As shown in FIG. 23, the first heat conductive material layer 51 is formed on the first insulation layer 31 and the side of the TSV structure 10 distal from the base substrate 1. As shown in FIG. 24, the first heat conductive material layer 51 is patterned to form the first heat conductive layer 61 and the first heat dissipation layer 71. The first heat conductive layer 61 is formed as a cylindrical shape with a bottom and is sleeved at an end of the TSV structure 10. The first heat dissipation layer 71 is formed as a cylindrical shape; the first heat dissipation layer 71 is connected to an edge of a cylinder wall of the first heat conductive layer 61; and the first heat dissipation layer 71 is located at a side of the first insulation layer 31 proximal to the TSV structure 10. Then the second heat conductive material layer 22 is formed on the first heat conductive layer 61, the first heat dissipation layer 71, and the side of the first insulation layer 31 distal from the base substrate 1. As shown in FIG. 25, a second insulation material layer 22 is patterned to form a second blind hole 42 and a second insulation layer 32; and an orthogonal projection of the second blind hole 42 on the base substrate 1 is at least partially overlapped with an orthogonal projection of the first heat conductive layer 61 on the base substrate 1 so as to expose a portion of the first heat conductive layer 61. As shown in FIG. 26, the second heat conductive material layer 52 is formed on the second insulation layer 32 and the side of the first heat conductive layer 61 distal from the base substrate 1.

As shown in FIG. 7, the second heat conductive material layer 52 is patterned to form a second heat conductive layer 62 and a second heat dissipation layer 72; the second heat conductive layer 62 is formed as a cylindrical shape with a bottom and is sleeved at a side of a portion of the first heat conductive layer 61 distal from the TSV structure 10; and the second heat dissipation layer 72 is connected to an edge of a cylinder wall of the second heat conductive layer 62 and is located at a side of the second insulation layer 32 distal from the base substrate 1. A third insulation material layer is formed at the second heat conductive layer 62, the second heat dissipation layer 72, and the side of the second insulation layer 32 distal from the base substrate 1 and the third insulation material layer is patterned to form a third blind hole and a third insulation layer 33; a orthogonal projection of the third blind hole on the base substrate 1 is at least partially overlapped with a orthogonal projection of the second heat conductive layer 62 on the base substrate 1 so as to expose a portion of the second heat conductive layer 62. The third heat conductive material layer is formed at the third insulation layer 33 and a side of the second heat conductive layer 62 distal from the base substrate 1 and the third heat conductive material layer is patterned to form the third heat conductive layer 63 and the third heat dissipation layer 73; the third heat conductive layer 63 is disposed at a side of the second heat conductive layer 62 distal from the TSV structure 10; the third heat dissipation layer 73 is connected to an edge of the third heat conductive layer 63 and is located at a side of the third insulation layer 33 distal from the base substrate 1.

Figure 27:
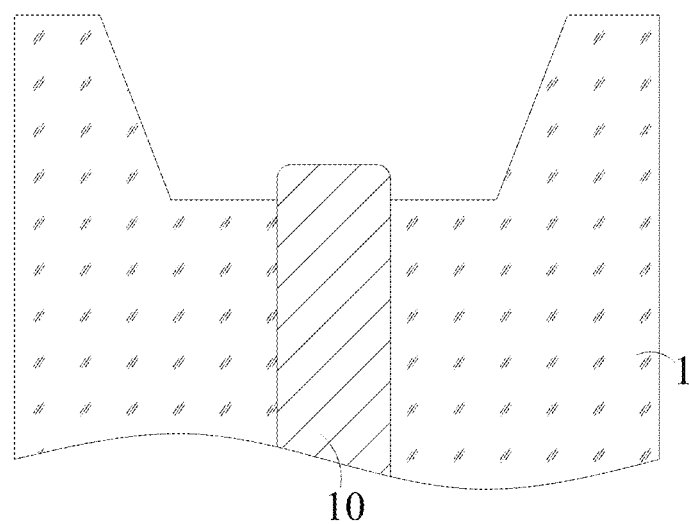
FIG. 27 is a first structural schematic diagram of a step of a further exemplary implementation of a method for manufacturing a semiconductor apparatus of this disclosure.
Figure 28:
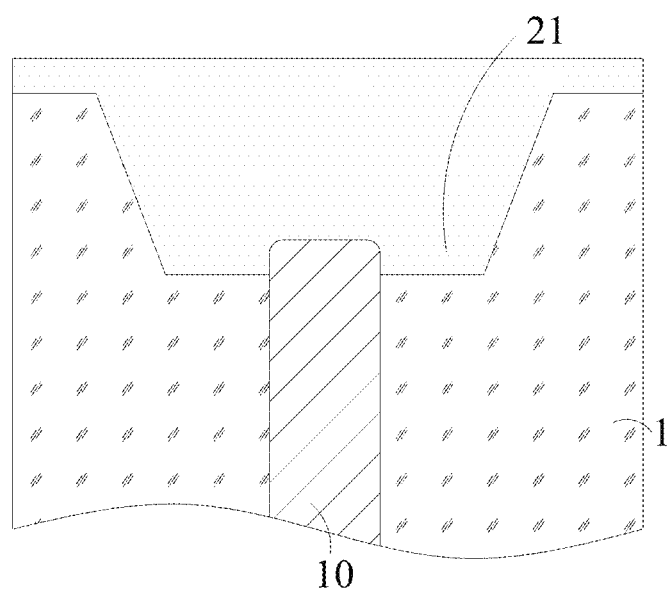
FIG. 28 is a second structural schematic diagram of a step of a further exemplary implementation of a method for manufacturing a semiconductor apparatus of this disclosure.
Figure 29:
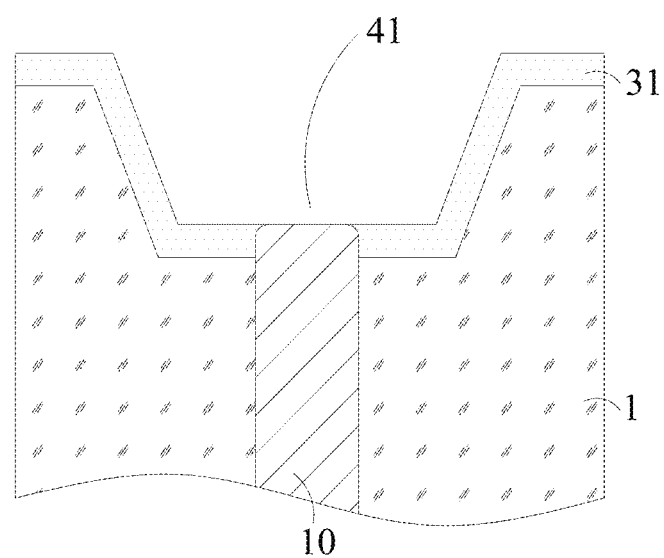
FIG. 29 is a third structural schematic diagram of a step of a further exemplary implementation of a method for manufacturing a semiconductor apparatus of this disclosure.
Figure 30:
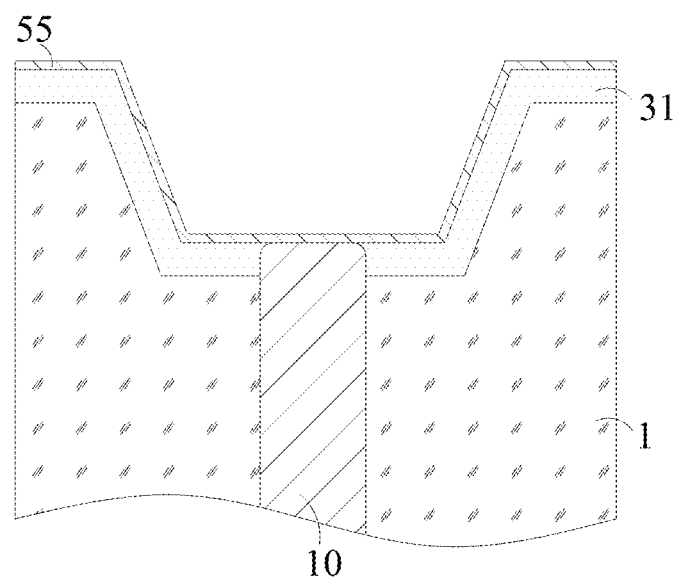
FIG. 30 is a fourth structural schematic diagram of a step of a further exemplary implementation of a method for manufacturing a semiconductor apparatus of this disclosure.
Figure 31:
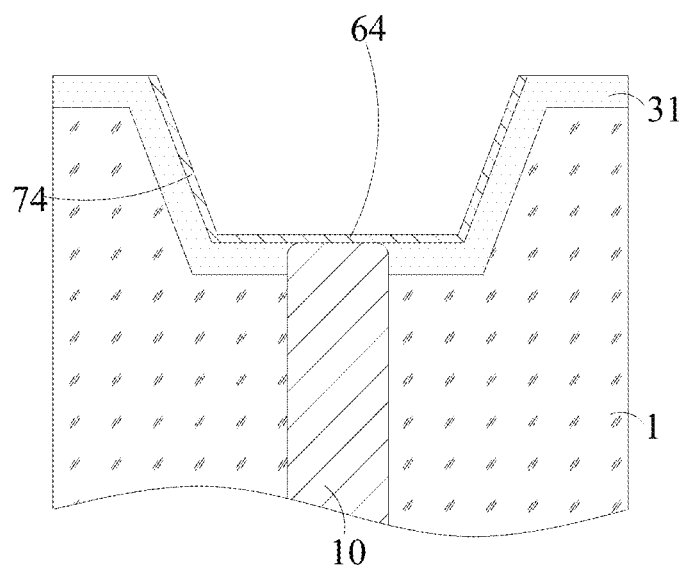
FIG. 31 is a fifth structural schematic diagram of a step of a further exemplary implementation of a method for manufacturing a semiconductor apparatus of this disclosure.
Figure 32:
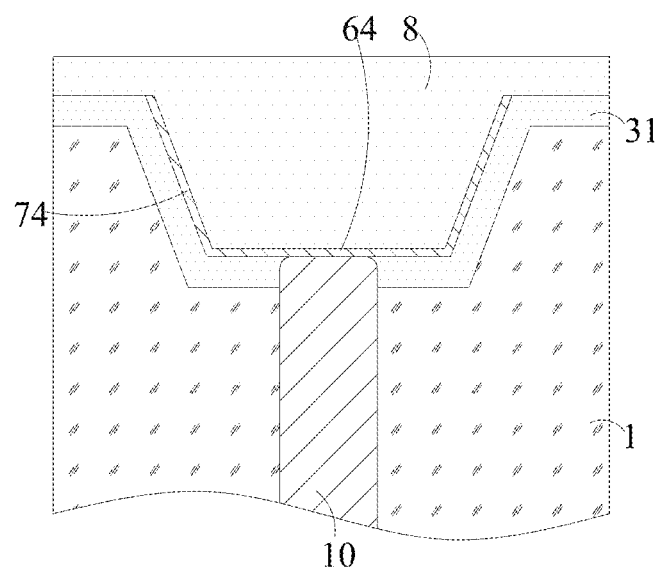
FIG. 32 is a sixth structural schematic diagram of a step of a further exemplary implementation of a method for manufacturing a semiconductor apparatus of this disclosure.

The method for manufacturing the semiconductor apparatus having three heat conductive layers and three heat dissipation layers are as above; certainly, one heat conductive layer 64 and one heat dissipation layer 74 can also be set. As shown in FIG. 27, the length of the first end of the TSV structure 10 protruding from the base substrate 1 is shorter than the length of that protruding from the base substrate 1 in the exemplary implementation. As shown in FIG. 28, the first insulation material layer 21 is formed on the base substrate 1 and the first end of the TSV structure 10. As shown in FIG. 29, the first insulation material layer 21 is patterned to form the first blind hole 41 such that the end surface of the first end of the TSV structure 10 exposed to the base substrate 1 is exposed to the first insulation layer 31. As shown in FIG. 30, the heat conductive material layer 55 is formed on the first insulation layer 31 and the end surface of the first end of the TSV structure 10. As shown in FIG. 31, the heat conductive material layer 55 is patterned to form a heat conductive layer 64 and a heat dissipation layer 74; the heat conductive layer 64 is in contact with the end surface of the first end of the TSV structure 10; and the heat dissipation layer 74 is connected to an edge of the heat conductive layer and is located at a side of the first insulation layer 31 distal from the base substrate 1. As shown in FIG. 32, the dielectric layer 8 is formed at the first insulation layer 31, the heat conductive layer, and the side of the heat dissipation layer 74 distal from the base substrate 1.

The features, structures, or characteristics described above can be combined into one or more implementations in any proper mode; if possible, the features discussed in each embodiment can be exchanged. In the description above, many specific details are provided to provide full understanding of the implementations of this disclosure. However, a person skilled in the art would recognize that the technical solutions of this disclosure can be practiced without one or more of specific details or other methods, assemblies, materials, and the like can be adopted. Under other conditions, well-known structures, materials, or operations are not shown in detail to avoid blurring aspects of this disclosure.

Although relativity terms are used in this specification, for example, "up" and "down" are used for describing correspondence of one assembly to another assembly marked in the drawings, these terms used in this specification is merely for convenience, for example, the direction of the example according to the accompanying drawings. As can be understood, if the apparatus marked in the drawings are turned over to be upside down, the assembly at "up" would be the assembly at "down". Other relativity terms, for example, "high", "low", "top", "bottom", and the like are also used for having similar meanings. When a certain structure is "on" other structures, it is possible that it refers to a certain structure is integrally formed on other structures, or refers to a certain structure is "directly" disposed on other structure, or refers to a certain structure is "indirectly" disposed on other structures through another structure.

In this specification, terms "one", "a", "the", "the", and "at least one" are used for representing the existence of one or more elements/constitution parts/and the like; terms "include", "comprise", and "have" are used for representing the open-type meaning of being included and refer to that additional elements/constitution parts/and the like may also exist except the listed elements/constitution parts/and the like; terms "first", "second", "third" and the like are merely sued for marking, rather than limiting the number of objects thereof.

As can be understood, this disclosure does not limit its application to the detailed structure and arranging modes of the parts proposed in this specification. This disclosure can have other implementations and can implement and execute in multiple modes. The preceding deformation modes and amendment modes fall within the scope of this disclosure. As can be understood, this specification discloses and limit all replaceable combinations of two or more separate features which are mentioned or apparent in the text and/or drawings extended by this disclosure. All of these different combinations constitute a plurality of replaceable aspects of this disclosure. The implementations of this specification explain the well-known optimal mode for implementing this disclosure and enable a person skilled in the art can use this disclosure.

What is claimed is:

1. A semiconductor apparatus, comprising:
    a substrate, provided with a groove on the substrate; and
    a through silicon via (TSV) structure, disposed on the substrate, a first end of the TSV structure being exposed in the groove, and a distance between an end surface of the first end and a bottom wall of the groove being smaller than a depth of the groove;
    wherein the substrate comprises:
        a base substrate, provided with a first groove on the base substrate, the first end being exposed in the first groove; and
        a first insulation layer, disposed on the base substrate, a first blind hole concentric with the first groove being provided on the first insulation layer, and the first blind hole making at least a portion of the first end of the TSV structure exposed to the base substrate exposed to the first insulation layer;
    wherein the semiconductor apparatus further comprises:
        a heat conductive layer group, disposed in the first blind hole, the heat conductive layer group being at least in contact with an end surface of the first end of the TSV structure, and a thickness of the heat conductive layer group decreasing with an increase of a distance from the end surface of the first end; and
        a heat dissipation layer group, connected to the heat conductive layer group, and extending towards a side distal from the TSV structure.

2. The semiconductor apparatus of claim 1, wherein the substrate comprises:
    the base substrate, the first end of the TSV structure being exposed to the base substrate; and
    the first insulation layer, disposed on the base substrate, the first blind hole being provided on the first insulation layer, and the first blind hole making at least the portion of the first end of the TSV structure exposed to the base substrate exposed to the first insulation layer.

3. The semiconductor apparatus of claim 1, wherein the first end of the TSV structure exposed to the base substrate is exposed to the first insulation layer;
    the heat conductive layer group comprises:
        a first heat conductive layer, disposed as a cylindrical shape with a bottom and sleeved at the first end;
        a second heat conductive layer, disposed as a cylindrical shape with a bottom and sleeved at a side of a portion of the first heat conductive layer distal from the TSV structure; and
        a third heat conductive layer, disposed at a side of a portion of the second heat conductive layer distal from the TSV structure; and
    the heat dissipation layer group comprises:
        a first heat dissipation layer, connected to an edge of a cylinder wall of the first heat conductive layer and located at a side of the first insulation layer distal from the base substrate;
        a second insulation layer, located at a side of the first heat dissipation layer proximal to the TSV structure;
        a second heat dissipation layer, connected to an edge of a cylinder wall of the second heat conductive layer and located at a side of the second insulation layer distal from the base substrate;
        a third insulation layer, located at a side of the second heat dissipation layer proximal to the TSV structure; and
        a third heat dissipation layer, connected to an edge of the third heat conductive layer and located at a side of the third insulation layer distal from the base substrate.

4. The semiconductor apparatus of claim 1, wherein the end surface of the first end of the TSV structure exposed to the substrate is exposed to the first insulation layer;
    the heat conductive layer group comprises:
        a heat conductive layer in contact with the end surface of the first end of the TSV structure; and
    the heat dissipation layer group comprises:
        a heat dissipation layer, connected to an edge of the heat conductive layer and located at a side of the first insulation layer proximal to the TSV structure.

5. The semiconductor apparatus of claim 1, further comprising:
    a plurality of radiation fins, each being in a cylindrical shape with a bottom having a bottom wall and a sidewall, the bottom wall being connected to an end of the heat dissipation layer group distal from the TSV structure, and the sidewall extending towards a side distal from the TSV structure.

6. The semiconductor apparatus of claim 5, wherein at least one of the radiation fins is connected between heat dissipation layer groups of two adjacent TSV structures.

7. The semiconductor apparatus of claim 1, further comprising:
    a dielectric layer, disposed at a side of the heat dissipation layer group distal from the TSV structure; and
    a metal barrier layer, disposed at a side of the dielectric layer distal from the TSV structure.

8. A three-dimensional integrated circuit comprising a semiconductor apparatus, wherein the semiconductor apparatus comprises:
    a substrate, provided with a groove on the substrate; and
    a TSV structure, disposed on the substrate, a first end of the TSV structure being exposed in the groove, and a distance between an end surface of the first end and a bottom wall of the groove being smaller than a depth of the groove;
    wherein the substrate comprises:
        a base substrate, provided with a first groove on the base substrate, the first end being exposed in the first groove; and
        a first insulation layer, disposed on the base substrate, a first blind hole concentric with the first groove being provided on the first insulation layer, and the first blind hole making at least a portion of the first end of the TSV structure exposed to the base substrate exposed to the first insulation layer:
wherein the semiconductor apparatus further comprises:
   a heat conductive layer group, disposed in the first blind hole, the heat conductive layer group being at least in contact with an end surface of the first end of the TSV structure, and a thickness of the heat conductive layer group decreasing with an increase of a distance from the end surface of the first end; and
   a heat dissipation layer group, connected to the heat conductive layer group, and extending towards a side distal from the TSV structure.

\* \* \* \* \*